United States Patent
Lin et al.

(10) Patent No.: US 9,514,815 B1
(45) Date of Patent: Dec. 6, 2016

(54) VERIFY SCHEME FOR RERAM

(71) Applicant: MACRONIX INTERNATIONAL CO., LTD., Hsinchu (TW)

(72) Inventors: Yu-Yu Lin, Hsinchu (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/877,740

(22) Filed: Oct. 7, 2015

Related U.S. Application Data

(60) Provisional application No. 62/161,112, filed on May 13, 2015.

(51) Int. Cl.
　　*G11C 11/16*　　(2006.01)
　　*G11C 13/00*　　(2006.01)

(52) U.S. Cl.
　　CPC ....... *G11C 13/0069* (2013.01); *G11C 13/0007* (2013.01); *G11C 13/0064* (2013.01); *G11C 13/0097* (2013.01)

(58) Field of Classification Search
　　CPC ........................... G11C 13/0069; G11C 11/161
　　USPC .................................................. 365/148, 158
　　See application file for complete search history.

(56) References Cited

U.S. PATENT DOCUMENTS

| | | | |
|---|---|---|---|
| 5,077,691 A | 12/1991 | Haddad et al. | |
| 5,126,973 A | 6/1992 | Gallia et al. | |
| 5,325,334 A | 6/1994 | Roh et al. | |
| 5,537,665 A | 7/1996 | Patel et al. | |
| 5,590,085 A | 12/1996 | Yuh et al. | |
| 5,621,691 A | 4/1997 | Park | |
| 5,732,030 A | 3/1998 | Dorney | |
| 5,812,466 A | 9/1998 | Lee et al. | |
| 5,953,270 A | 9/1999 | Kim | |
| 5,959,904 A | 9/1999 | Oh | |
| 5,999,463 A | 12/1999 | Park et al. | |
| 6,002,620 A | 12/1999 | Tran et al. | |
| 6,094,384 A | 7/2000 | Ka | |

(Continued)

OTHER PUBLICATIONS

Baek, I.G., "Highly Scalable Non-volatile Resistive Memory using Simple Binary Oxide Driven by Asymmetric Unipola Voltage Pulses," IEEE IEDM Dec. 13-15, 2004, 4 pages.

(Continued)

*Primary Examiner* — Michael Tran
(74) *Attorney, Agent, or Firm* — Haynes Beffel & Wolfeld LLP

(57) ABSTRACT

Circuitry coupled to a programmable element comprising metal oxide is configured to execute a program-verify operation including: an initial cycle of a program operation and a verify operation, and subsequent cycles. The initial cycle includes an initial instance of the program operation to establish a cell resistance of the programmable element, and an initial instance of the verify operation to determine whether the cell resistance of the memory cell is within the target resistance range. At least one of the subsequent cycles includes an additional pulse having a second polarity to the programmable element, and a subsequent instance of the verify operation. The first polarity of the initial program pulse and the second polarity of the additional pulse have opposite polarities. A subsequent instance of the program operation includes applying a subsequent program pulse having the first polarity to the programmable element.

23 Claims, 17 Drawing Sheets

(56) References Cited

U.S. PATENT DOCUMENTS

| | | | |
|---|---|---|---|
| 6,115,300 A | 9/2000 | Massoumi et al. | |
| 6,141,268 A | 10/2000 | Chen et al. | |
| 6,205,515 B1 | 3/2001 | Huang | |
| 6,317,355 B1 | 11/2001 | Kang | |
| 6,337,816 B1 | 1/2002 | Park et al. | |
| 6,343,037 B1 | 1/2002 | Park et al. | |
| 6,445,626 B1 | 9/2002 | Hsu et al. | |
| 6,490,208 B2 | 12/2002 | Yoon | |
| 6,496,425 B1 | 12/2002 | Abedifard et al. | |
| 6,603,690 B1 | 8/2003 | Chen et al. | |
| 6,665,221 B2 | 12/2003 | Abedifard et al. | |
| 6,671,214 B2 | 12/2003 | Abedifard et al. | |
| 6,674,676 B1 | 1/2004 | Hsu et al. | |
| 6,678,191 B2 | 1/2004 | Lee et al. | |
| 6,849,905 B2 | 2/2005 | Ilkbahar et al. | |
| 6,915,467 B2 | 7/2005 | Pilo | |
| 6,966,012 B1 | 11/2005 | Gandhi | |
| 7,061,790 B2 * | 6/2006 | Morimoto | G11C 11/5685 365/148 |
| 7,064,990 B1 | 6/2006 | Dawson et al. | |
| 7,134,057 B1 | 11/2006 | Kaushik et al. | |
| 7,251,173 B2 | 7/2007 | Lunde et al. | |
| 7,570,536 B2 | 8/2009 | Chi | |
| 7,738,308 B2 | 6/2010 | Afghahi et al. | |
| 7,760,553 B2 | 7/2010 | Jang | |
| 7,943,920 B2 | 5/2011 | Chien et al. | |
| 7,978,496 B2 | 7/2011 | Kumar et al. | |
| 8,134,139 B2 | 3/2012 | Lin et al. | |
| 8,279,656 B2 | 10/2012 | Chien et al. | |
| 8,355,271 B2 * | 1/2013 | Rabkin | G11C 13/0069 365/148 |
| 8,962,466 B2 | 2/2015 | Lee et al. | |
| 9,165,671 B2 * | 10/2015 | Lee | G11C 16/3459 |
| 9,165,680 B2 | 10/2015 | Hung et al. | |
| 2002/0142609 A1 | 10/2002 | Hart et al. | |
| 2003/0031958 A1 | 2/2003 | Tohge et al. | |
| 2004/0123181 A1 | 6/2004 | Moon et al. | |
| 2005/0247921 A1 | 11/2005 | Lee et al. | |
| 2007/0105372 A1 | 5/2007 | Geusic et al. | |
| 2009/0180340 A1 | 7/2009 | Song et al. | |
| 2009/0184396 A1 | 7/2009 | Kim et al. | |
| 2010/0027326 A1 * | 2/2010 | Kim | G11C 13/0069 365/163 |
| 2010/0059808 A1 | 3/2010 | Zheng et al. | |
| 2010/0107004 A1 | 4/2010 | Bottelli et al. | |
| 2010/0308298 A1 | 12/2010 | Ninomiya et al. | |
| 2011/0002155 A1 | 1/2011 | Arita et al. | |
| 2011/0140069 A1 | 6/2011 | Inoue | |
| 2011/0180775 A1 | 7/2011 | Lin et al. | |
| 2012/0075909 A1 * | 3/2012 | Nakura | G11C 13/0007 365/148 |
| 2012/0075943 A1 | 3/2012 | Chen et al. | |
| 2012/0097915 A1 | 4/2012 | Mikawa et al. | |
| 2012/0181599 A1 | 7/2012 | Lung | |
| 2012/0188813 A1 | 7/2012 | Chien et al. | |
| 2012/0280199 A1 | 11/2012 | Takagi | |
| 2013/0178042 A1 | 7/2013 | Ninomiya et al. | |
| 2013/0182487 A1 | 7/2013 | Lee et al. | |
| 2014/0104933 A1 * | 4/2014 | Yamahira | G11C 7/04 365/148 |
| 2014/0131653 A1 | 5/2014 | Lee et al. | |
| 2014/0233299 A1 * | 8/2014 | Lan | G11C 13/0064 365/148 |
| 2015/0023094 A1 * | 1/2015 | Lam | G11C 11/5628 365/163 |
| 2015/0043274 A1 * | 2/2015 | Liu | G11C 13/0064 365/163 |
| 2015/0155037 A1 * | 6/2015 | Lee | G11C 13/0069 365/148 |
| 2015/0270009 A1 * | 9/2015 | Lee | G11C 16/3459 365/185.22 |

OTHER PUBLICATIONS

Chen, An, et al., "Non-Volatile Resistive Switching for Advanced Memory Applications," IEEE IEDM, Dec. 5-7, 2005, 4 pages.

Kozicki, Michael N., et al., "A Low-Power Nonvolatile Switching Element Based on Copper-Tungsten Oxide Solid Electrolyte," IEEE Trans. on Nanotechnology, V. 5, No. 5, Sep. 2006, 10 pages.

* cited by examiner

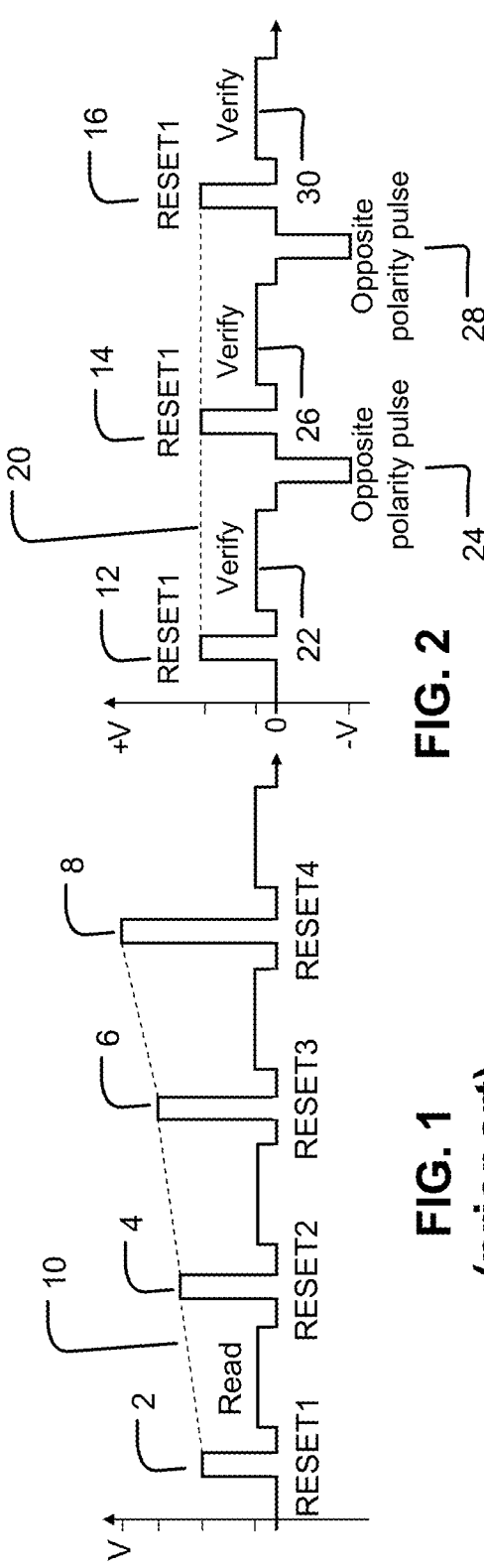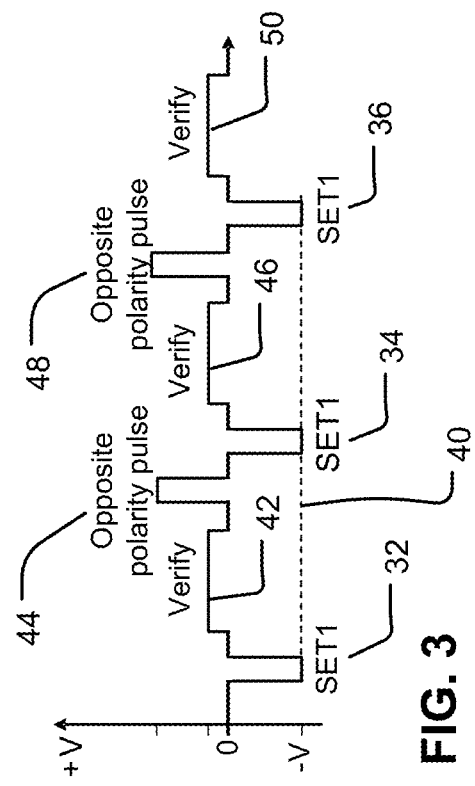

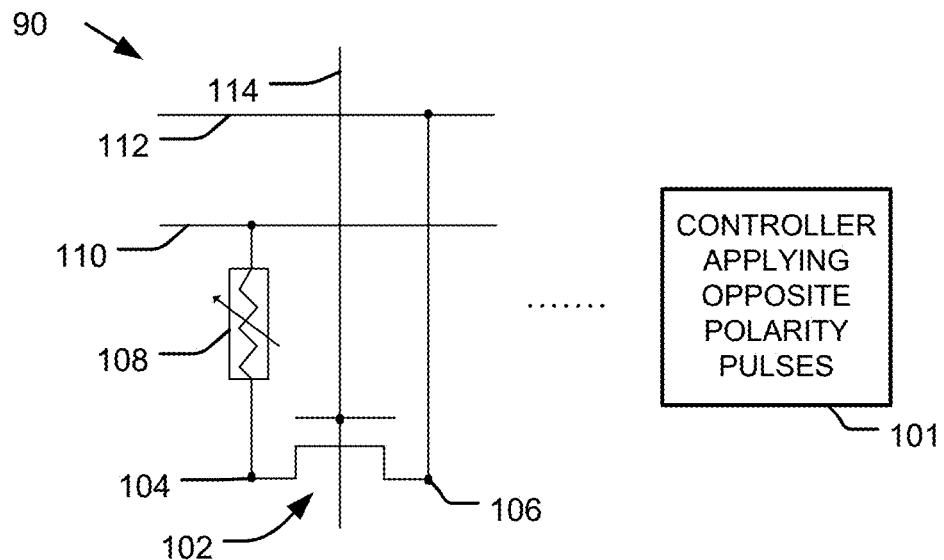
FIG. 4A
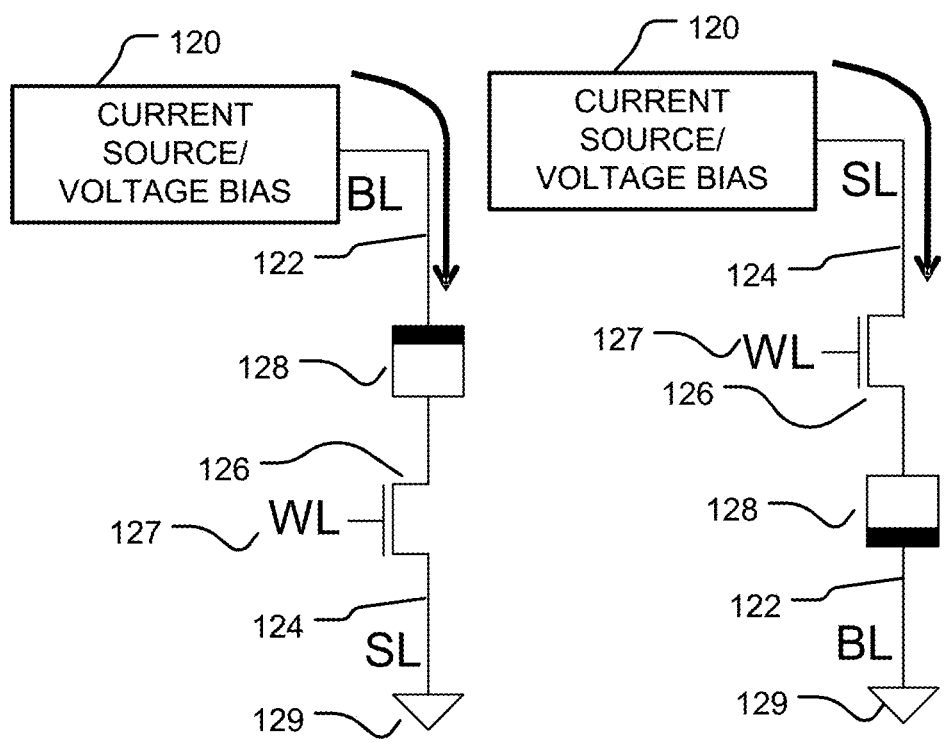
FIG. 4B        FIG. 4C

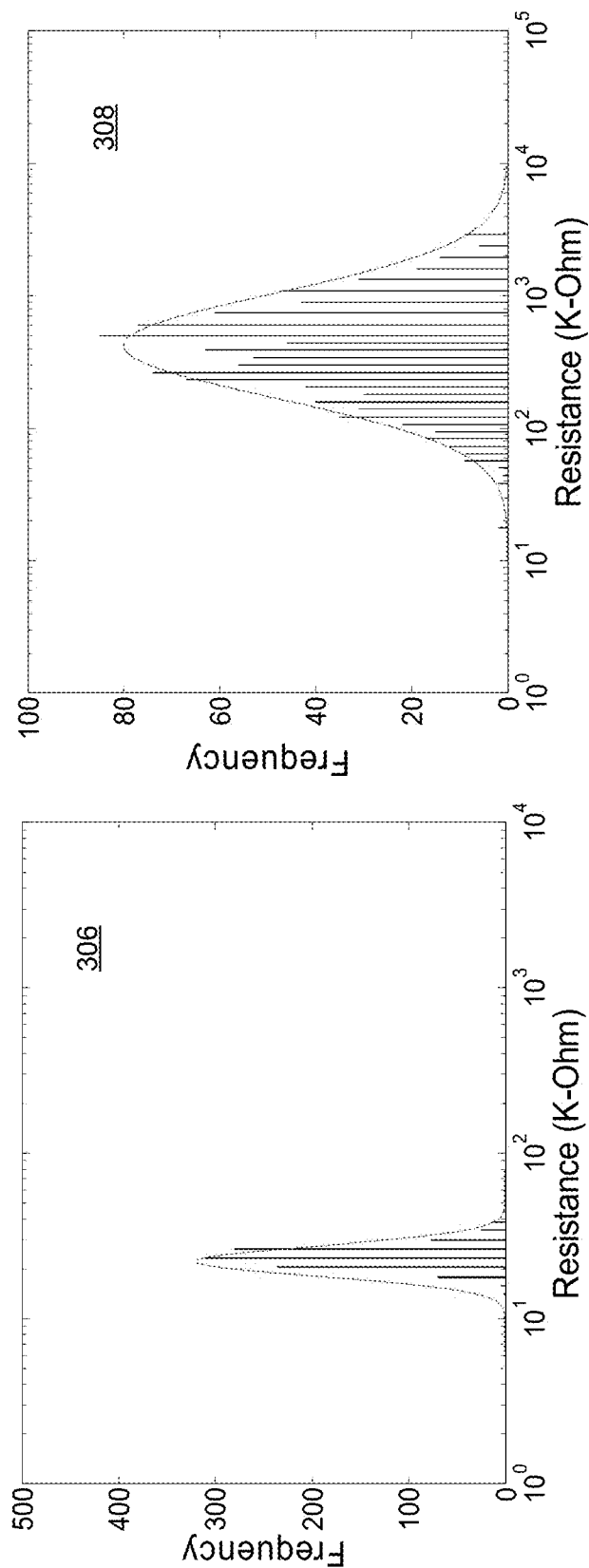

US 9,514,815 B1

VERIFY SCHEME FOR RERAM

PRIORITY APPLICATION

This application claims the benefit of U.S. Provisional Patent Application No. 62/161,112 filed 13 May 2015. The application is incorporated herein by reference.

BACKGROUND OF THE INVENTION

Field of the Invention

The present invention relates to high density memory arrays based on RRAM devices, and particularly relates to a verify scheme for such devices.

Description of Related Art

Resistive random access memory (RRAM) is a type of nonvolatile memory that includes metal oxide material which changes resistance between two or more stable resistance ranges by application of electrical pulses at levels suitable for implementation in integrated circuits. The resistance can be read and written via random access. The access lines coupled to the memory cells are connected to circuitry to perform operations, such as SET and RESET operations, which change the state of the memory element in order to store or erase data.

If the data is not stored successfully, the conventional approach then strengthens the operation conditions, such as greater amplitude and/or longer pulse duration. Such stronger operation conditions, however, stress and damage the memory element, which makes the device less reliable over repeated use.

It is desirable to provide a new verification scheme for RRAMs to reduce stress and damage to the memory element.

SUMMARY

In various embodiments of the technology, after a program verify operation fails, follow-on pulses do not have to increase in amplitude for successful programming. Because the amplitude does not have to increase, the memory devices undergo less stress and are more reliable. In various embodiments of the technology, after a program verify operation fails, a pulse with a polarity opposite to the polarity of the program pulse is applied after the failed program verify operation and prior to the subsequent program pulse.

One aspect of the technology is an integrated circuit, comprising a programmable element comprising metal oxide, and circuitry coupled to the programmable element and configured to execute a program-verify operation.

The program-verify operation includes (i) an initial cycle of a program operation and a verify operation, and then (ii) subsequent cycles of the program operation and the verify operation, responsive to the cell resistance of the programmable element not being within the target resistance range after the initial cycle.

The initial cycle of the program operation and the verify operation includes an initial instance of the program operation to establish a cell resistance of the programmable element. The initial instance of the program operation includes applying an initial program pulse having a first polarity to the programmable element cell. Then the initial cycle includes an initial instance of the verify operation to determine whether the cell resistance of the programmable element is within a target resistance range.

The subsequent cycles of the program operation and the verify operation, are iterated until the cell resistance of the programmable element is within the target resistance range. At least one of the subsequent cycles includes an additional pulse having a second polarity to the programmable element. The first polarity of the initial program pulse and the second polarity of the additional pulse have opposite polarities. The subsequent cycle(s) include a subsequent instance of the program operation including applying a subsequent program pulse having the first polarity to the programmable element. Then the subsequent cycle(s) include a subsequent instance of the verify operation to determine whether the cell resistance of the programmable element is within the target resistance range.

In some embodiments of the integrated circuit, the subsequent cycles of the program operation and the verify operation, are iterated until the cell resistance of the programmable element memory cell is within the target resistance range or a maximum number is performed of cycles of the program operation and the verify operation.

In some embodiments of the integrated circuit, the initial program pulse and the subsequent program pulse are reset pulses. In some embodiments of the integrated circuit, the initial program pulse and the subsequent program pulse are set pulses.

In some embodiments of the integrated circuit, a first magnitude of the initial program pulse is at least as large as later magnitudes of program pulses of the program operation of the subsequent cycles.

In some embodiments of the integrated circuit, another program operation includes another initial cycle of the program operation and the verify operation followed by further subsequent cycles of the program operation and the verify operation.

In some embodiments of the integrated circuit, a cumulative pass rate of the program operation after at least one of the subsequent cycles exceeds 97%.

In some embodiments of the integrated circuit, the programmable element has a programmable resistance.

Another aspect of the technology is an integrated circuit, comprising an array of memory cells and programmable elements comprising metal oxide, and circuitry coupled to the memory cells in the array. The circuitry is configured to execute a program-verify operation on at least a first memory cell in the array, as disclosed herein.

In some embodiments of the integrated circuit, a first subset of the array of memory cells is programmed to within the target resistance range after only the initial cycle of the program operation and the verify operation, and a second subset of the array of memory cells is programmed to within the target resistance range after the initial cycle of the program operation and the verify operation and at least one of the subsequent cycles of the program operation and the verify operation. A first mean resistance of the first subset of the array of memory cells is at least as large as a second mean resistance of the second subset of the array of memory cells.

In some embodiments of the integrated circuit, a first resistance distribution results from the program-verify operation being performed on the memory cells in the array with reset pulses, and a second resistance distribution results from the program-verify operation being performed on the memory cells in the array with set pulses. An open resistance window separates a lower 99.5% of the first resistance distribution and a lower 99.5% of the second resistance distribution. In some embodiments, this open resistance window occurs despite an overlap between the first resistance distribution and the second resistance distribution after only the initial cycle of the program operation and the verify operation.

In some embodiments of the integrated circuit, despite a first magnitude of the initial program pulse is at least as large as later magnitudes of program pulses of the program operation of the subsequent cycles, a cumulative pass rate for the memory cells in the array increases with an additional one of the subsequent cycles of the program operation and the verify operation.

Yet another aspect of the technology is a method, comprising:
executing a program-verify operation on at least a first memory cell comprising a programmable element comprising metal oxide in a memory array of an integrated circuit, including: (i) performing an initial cycle of a program operation and a verify operation, and (ii) performing subsequent cycles of the program operation and the verify operation, as disclosed herein.

BRIEF DESCRIPTION OF THE DRAWINGS

FIG. 1 is a graph of voltage versus time, showing a series of reset programming operation pulses with increasing amplitudes, in response to failed program verify operations.

FIG. 2 is a graph of voltage versus time, showing, in response to failed program verify operations, (i) a series of reset programming operation pulses with nonincreasing amplitudes and (ii) pulses having a polarity opposite to the reset programming operation pulses.

FIG. 3 is a graph of voltage versus time, showing, in response to failed program verify operations, (i) a series of reset programming operation pulses with nonincreasing amplitudes and (ii) pulses having a polarity opposite to the reset programming operation pulses.

FIG. 4A is a schematic of a memory cell in accordance with an embodiment.

FIGS. 4B and 4C are schematics of alternatives to bias a memory cell in accordance with different arrangements of source line and bit line.

FIGS. 8 and 9 are respectively graphs of the low and high resistance state distributions of the memory array.

DETAILED DESCRIPTION

Figure 5:
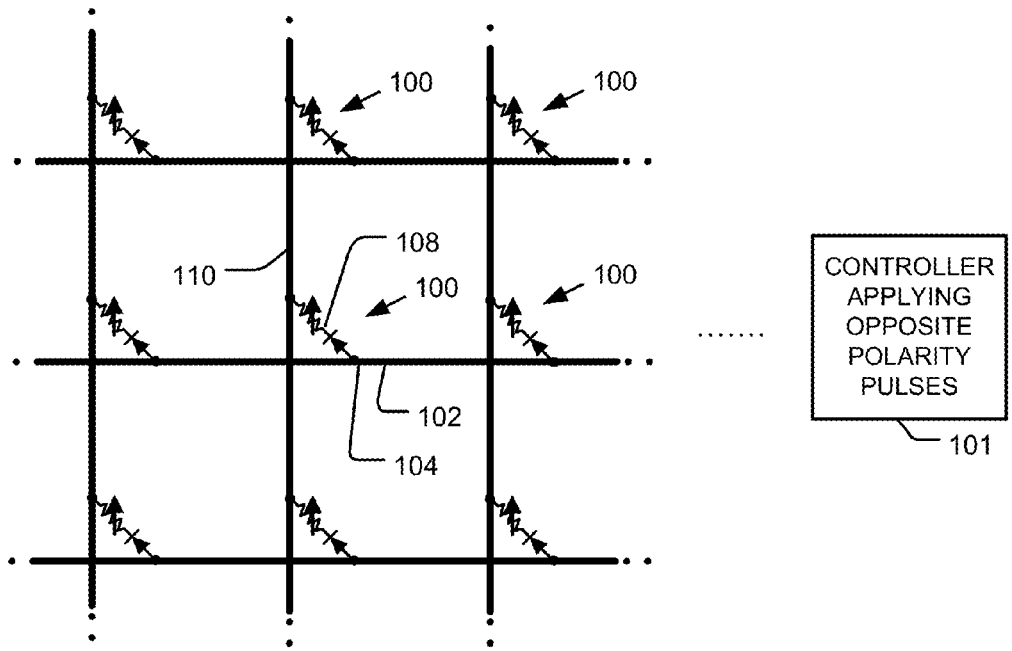
FIG. 5 is a schematic of a cross-point memory cell array in accordance with an embodiment.

FIG. 1 is a graph of voltage versus time, showing a series of reset programming operation pulses with increasing amplitudes, in response to failed program verify operations.

A selected memory cell undergoes multiple cycles of programming reset and verify operations. In each cycle, a programming reset operation occurs, followed by a verify operation which reads the selected memory cell.

With the shown graph, four cycles of programming reset and verify operations are shown as 2, 4, 6, and 8. With each subsequent cycle, the magnitude of the programming reset pulse increases after a failed verify, to perform incremental step pulse programming (ISPP). The programming pulse names RESET1, RESET2, RESET3, and RESET4 indicate the increasing magnitudes. A positive slope trend line 10 connects the tops of the programming pulses, indicating the increasing magnitudes.

FIG. 2 is a graph of voltage versus time, showing, in response to failed program verify operations, (i) a series of reset programming operation pulses with nonincreasing amplitudes and (ii) pulses having a polarity opposite to the reset programming operation pulses.

An initial cycle includes RESET1 programming operation pulse 12 followed by verify operation 22. After the initial cycle fails programming, a subsequent cycle includes opposite polarity pulse 24, RESET1 programming operation pulse 14, and then verify operation 26. After the subsequent cycle fails programming, another subsequent cycle includes opposite polarity pulse 28, RESET1 programming operation pulse 16, and then verify operation 30. The same programming pulse name RESET1 indicates the nonincreasing magnitudes of the programming pulses. The flat trend line 20 connects the tops of the programming pulses, indicating the nonincreasing magnitudes. In the shown embodiment, a single opposite polarity pulse is shown. In other embodiments, multiple opposite polarity pulses can precede the subsequent program pulse.

FIG. 3 is a graph of voltage versus time, showing, in response to failed program verify operations, (i) a series of reset programming operation pulses with nonincreasing amplitudes and (ii) pulses having a polarity opposite to the reset programming operation pulses.

An initial cycle includes SET1 programming operation pulse 32 followed by verify operation 42. After the initial cycle fails, a subsequent cycle includes opposite polarity pulse 44, SET1 programming operation pulse 34, and then verify operation 46. After the subsequent cycle fails, another subsequent cycle includes opposite polarity pulse 48, SET1 programming operation pulse 36, and then verify operation 50. The same programming pulse name SET1 indicates the nonincreasing magnitudes for the programming pulses. The flat trend line 40 connects the tops of the programming pulses, indicating the nonincreasing magnitudes of the programming pulses. In the shown embodiment, a single opposite polarity pulse is shown. In other embodiments, multiple opposite polarity pulses can precede the subsequent program pulse.

FIG. 4A is a schematic of a memory cell 90 in accordance with an embodiment. The memory cell 90 includes an access device, transistor 102, with a first current carrying terminal 104 and a second current carrying terminal 106. The memory cell includes a memory element 108 located between the first current carrying terminal 104 and a first access line 110, such as a bit line, and a second access line 112, such as a source line, connected to the second current carrying terminal 106. In the embodiment shown with the access device as transistor 102, the memory device further includes a third access line 114, such as a word line, connected to the gate of the transistor 102. A controller 101 is schematically shown which applies pulses to the memory cell 90 with a polarity opposite to the polarity of the programming pulse.

FIGS. 4B and 4C are alternative embodiments of applying gate voltage to a selector and a bias voltage to a source line or a bit line.

In FIGS. 4B and 4C, current source/voltage bias 120 provides current from a current source for a SET operation, or provides a voltage for a RESET operation. A reference voltage 129 such as a ground is at the opposite end.

In FIG. 4B, the following elements are in between the current source or voltage bias 120, and the ground 129: bit line 122, memory element 128, access transistor 126 controlled by word line 127, and source line 124. In FIG. 4C, the following elements are in between the current source or voltage bias 120, and the ground 129: source line 124, access transistor 126 controlled by word line 127, memory element 128, and bit line 122.

In one embodiment, the initial reset pulse and subsequent reset pulses are a bias in a range of 1.2 V to 5 V, for example 2.3 V, applied to the bit line 122 of FIG. 4B or to the source line 124 of FIG. 4C, and a gate voltage in a range of 1.6 V to 5V, for example 2.8 V, in a range of 10 nanosecond to 10 microseconds, for example 800 nanoseconds, applied to the word line 127 of FIG. 4B or 4C. The opposite polarity pulse has 126 microamperes for 800 nanoseconds (see set pulse for wider ranges), with an opposite polarity voltage in contrast with the reset pulses.

In another embodiment, the initial set pulse and subsequent set pulses are in a range from 40 to 350 microamperes, such as 126 microamperes, in a range from 10 nanoseconds to 10 microseconds, for example about 800 nanoseconds. The opposite polarity pulse has an example bias of 2.3 V applied to the bit line 122 of FIG. 4B or to the source line 124 of FIG. 4C, and a gate voltage of 2.8 V for 800 nanoseconds for example (see reset pulse for wider ranges), applied to the word line 127 of FIG. 4B or 4C, with an opposite polarity voltage in contrast with the set pulses.

In various embodiments, the pulse amplitude and width can be modulated to optimize the resistance distribution. Also, the reverse pulse magnitude can be smaller in order to reduce the device stress. For example in RESET1, the pulse amplitude or width of the programming operation pulse 12 could be larger, equal or smaller than the pulse amplitude or width of the programming operation pulse 14. Likewise, the pulse amplitude or width of the programming operation pulse 32 could be larger, equal or smaller than the pulse amplitude or width of the programming operation pulse 34 in SET1.

FIG. 5 is a schematic of a cross-point memory cell array in accordance with a diode access device. In such embodiments, a third access line is not included to access the memory cell 108. Instead of MOS transistors, bipolar transistors or diodes may be used as access devices in some embodiments. A controller 101 is schematically shown which applies pulses to the memory cell 108 with a polarity opposite to the polarity of the programming pulse.

Figure 6:
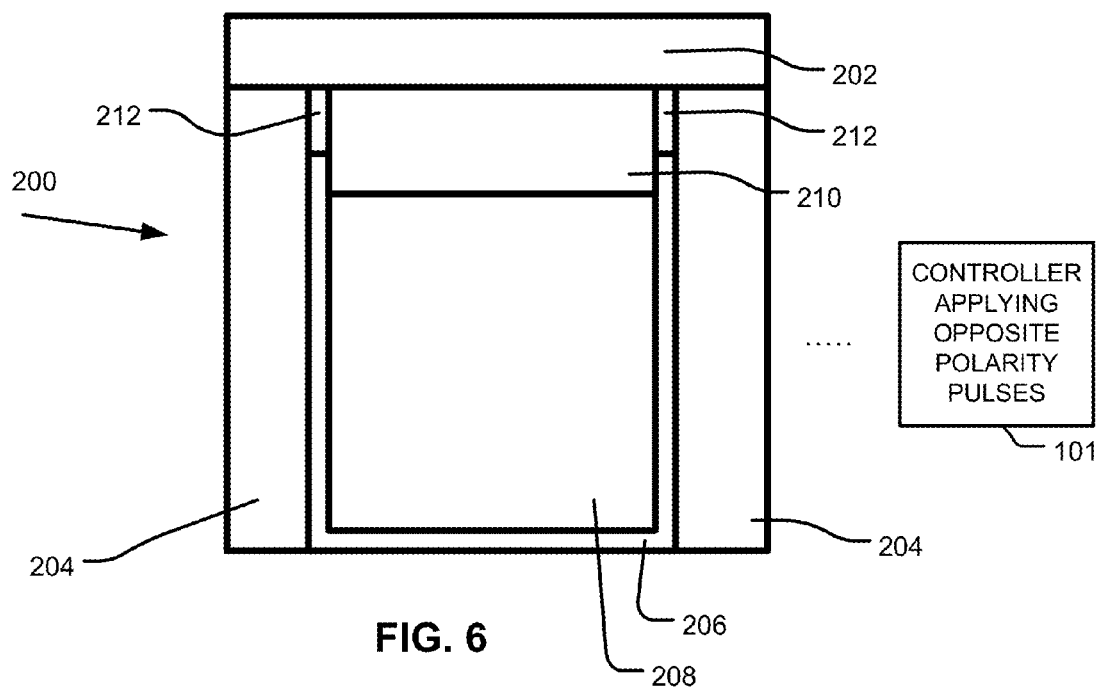
FIG. 6 is a simplified cross-sectional view of an example of a variable resistance memory cell.

FIG. 6 is a simplified cross-sectional view of an example of a programmable resistance memory cell 200. A conductive plug 208 (bottom electrode) extends through an insulating dielectric layer 204, for example a silicon dioxide layer. In one embodiment, the conductive plug 208 may comprise an adhesion layer 206. The conductive plug 208 on one end may be coupled to an access device, such as a drain terminal of an access transistor, a terminal of a diode, or an access line. In the embodiment shown, the conductive plugs are tungsten plugs and the adhesion layers are TiN liners including sidewall portions and bottom portions. A memory element 210 is on the conductive plug 208. The memory element 210 can be an oxide of the conductive plug 208. On top of the adhesion layer 206 is a region of oxidized adhesion layer 212. A conductive layer 202 (top electrode) is formed over at least the memory element 210. In various embodiments, the material of the conductive plugs could be other metals such as Ti, Ta, Al, TiN, TaN, Cu, Zr, Gd, Yb, and Hf. The adhesion layer can be a conductive metal nitride including titanium nitride, tungsten nitride, tantalum nitride, titanium, and others. Adhesion layers can also be a metal such as titanium.

The memory element can comprise materials such as a metal oxide, including tungsten oxide (WOx), hafnium oxide (HfOx), titanium oxide (TiOx), tantalum oxide (TaOx), titanium nitride oxide (TiNO), nickel oxide (NiOx), ytterbium oxide (YbOx), aluminum oxide (AlOx), niobium oxide (NbOx), zinc oxide (ZnOx), copper oxide (CuOx), anadium oxide (VOx), molybdenum oxide (MoOx), ruthenium oxide (RuOx), copper silicon oxide (CuSiOx), silver zirconium oxide (AgZrO), aluminum nickel oxide (AlNiO), aluminum titanium oxide (AlTiO), gadolinium oxide (GdOx), gallium oxide (GaOx), zirconium oxide (ZrOx), chromium doped SrZrO3, chromium doped SrTiO3, PCMO, or LaCaMnO, etc.

Figure 7:
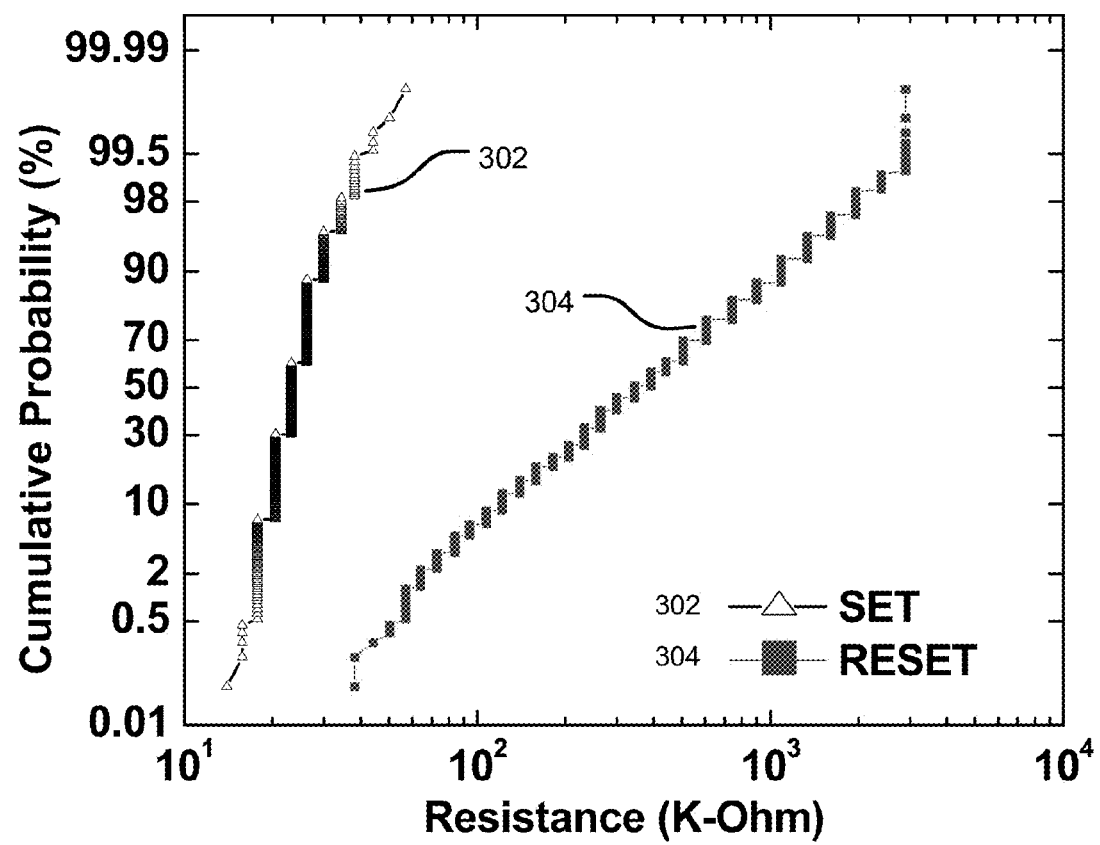
FIG. 7 is a cumulative probability graph of the resistance distribution of the memory array, without repetitions of programming pulses.

FIG. 7 is a cumulative probability graph of the resistance distribution of the memory array, without repetitions of programming pulses.

Trace 302 shows the array resistance distribution after one reset programming pulse, without further adjustment of resistance values. Trace 304 shows the array resistance distribution after one set programming pulse, without further adjustment of resistance values. Slight overlap of about 3% exists between the high resistance state following the reset pulse, and the low resistance state following the set pulse.

FIGS. 8 and 9 are respectively graphs of the low and high resistance state distributions of the memory array.

FIG. 8 shows the low resistance state distribution of the array after one set programming pulse, without further adjustment of resistance values. FIG. 9 shows the high resistance state distribution of the array after one reset programming pulse, without further adjustment of resistance values. Both FIGS. 8 and 9 show Gaussian functions, which suggests the statistical nature of both set and reset programming operations.

Figure 10:
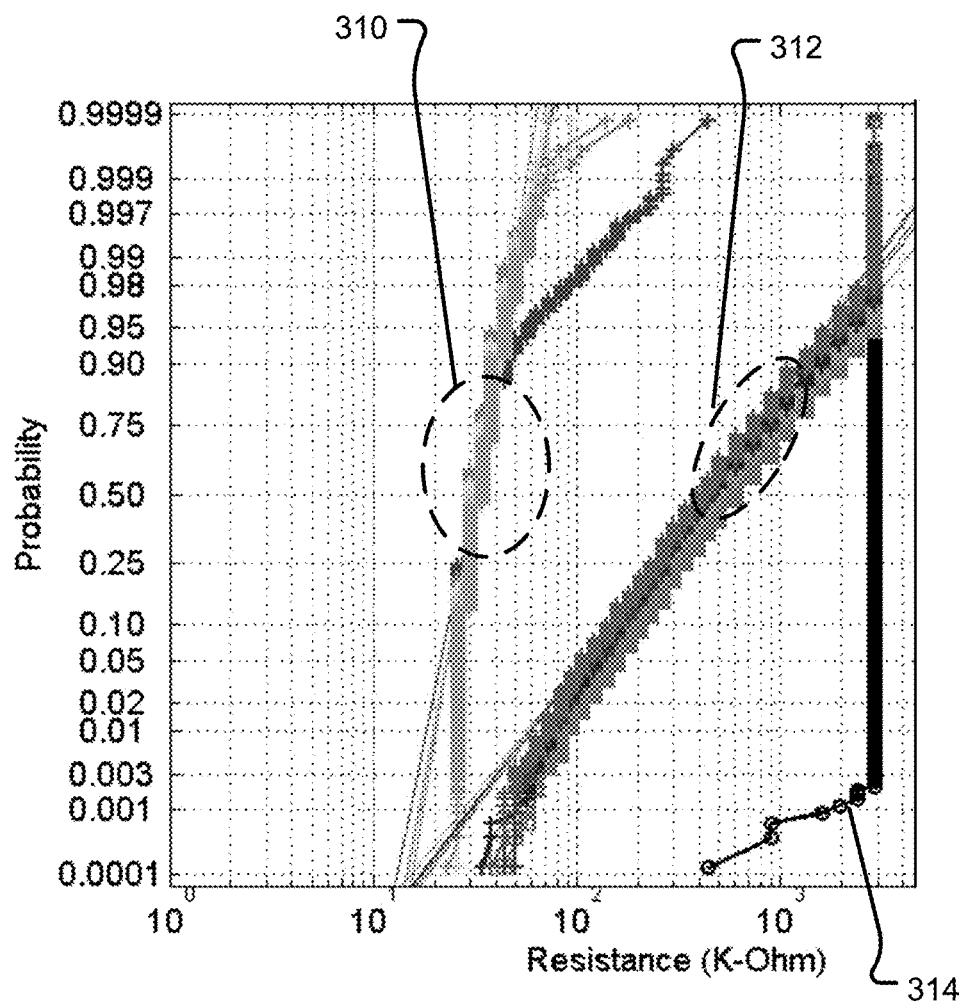
FIG. 10 is a cumulative probability graph of the resistance distribution of the memory array, after a set programming pulse and after a reset programming pulse, showing the absence of a resistance window without program verify.

FIG. 10 is a cumulative probability graph of the resistance distribution of the memory array, after a set programming pulse and after a reset programming pulse, showing the absence of a resistance window without program verify.

The traces indicated generally by 310 shows the low resistance state distribution of the array after one set programming pulse, without further adjustment of resistance values. The traces indicated generally by 312 shows the high resistance state distribution of the array after one reset programming pulse, without further adjustment of resistance values. Trace 314 shows the initial resistance distribution of the array. No resistance window exists between the high probability portion of traces 310 and the low probability portion of traces 312. Thus program verify is required to open a resistance windows between the low and high resistance states.

Figure 11:
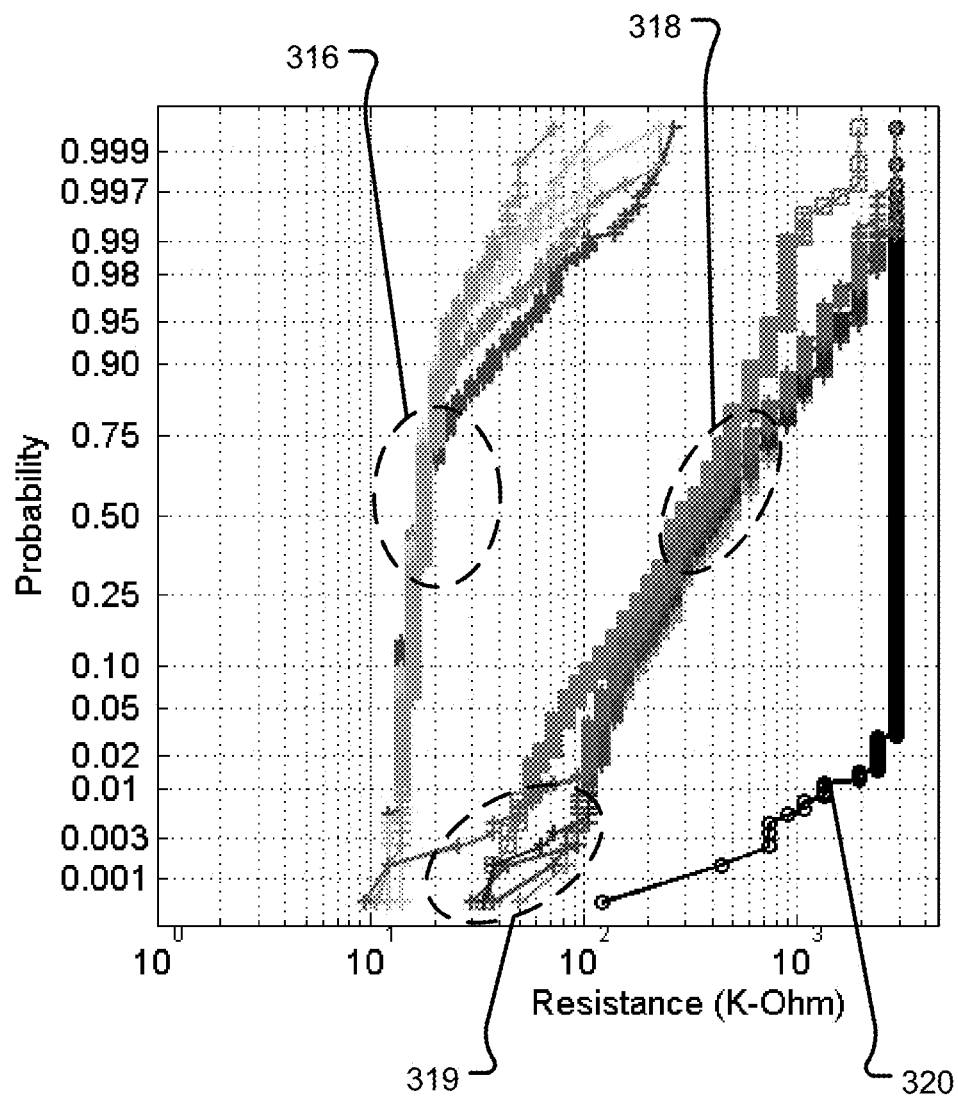
FIG. 11 is a cumulative probability graph of the resistance distribution of the memory array, after a set programming pulse and after a reset programming pulse, showing the degraded resistance state after cycling.

FIG. 11 is a cumulative probability graph of the resistance distribution of the memory array, after a set programming pulse and after a reset programming pulse, showing the degraded resistance state after cycling.

The traces indicated generally by 316 show the low resistance state distribution of the array after set programming. The traces indicated generally by 318 show the high resistance state distribution of the array after reset programming. Trace 320 shows the initial resistance distribution of the array. In trace groups 316 and 318, ISPP increases the strength of programming after each pulse, which stresses the resistive memory element of the memory cells. As a result, the low probability portion of traces 319 shows damage by bending towards the low resistance direction.

Figures 12, 13:
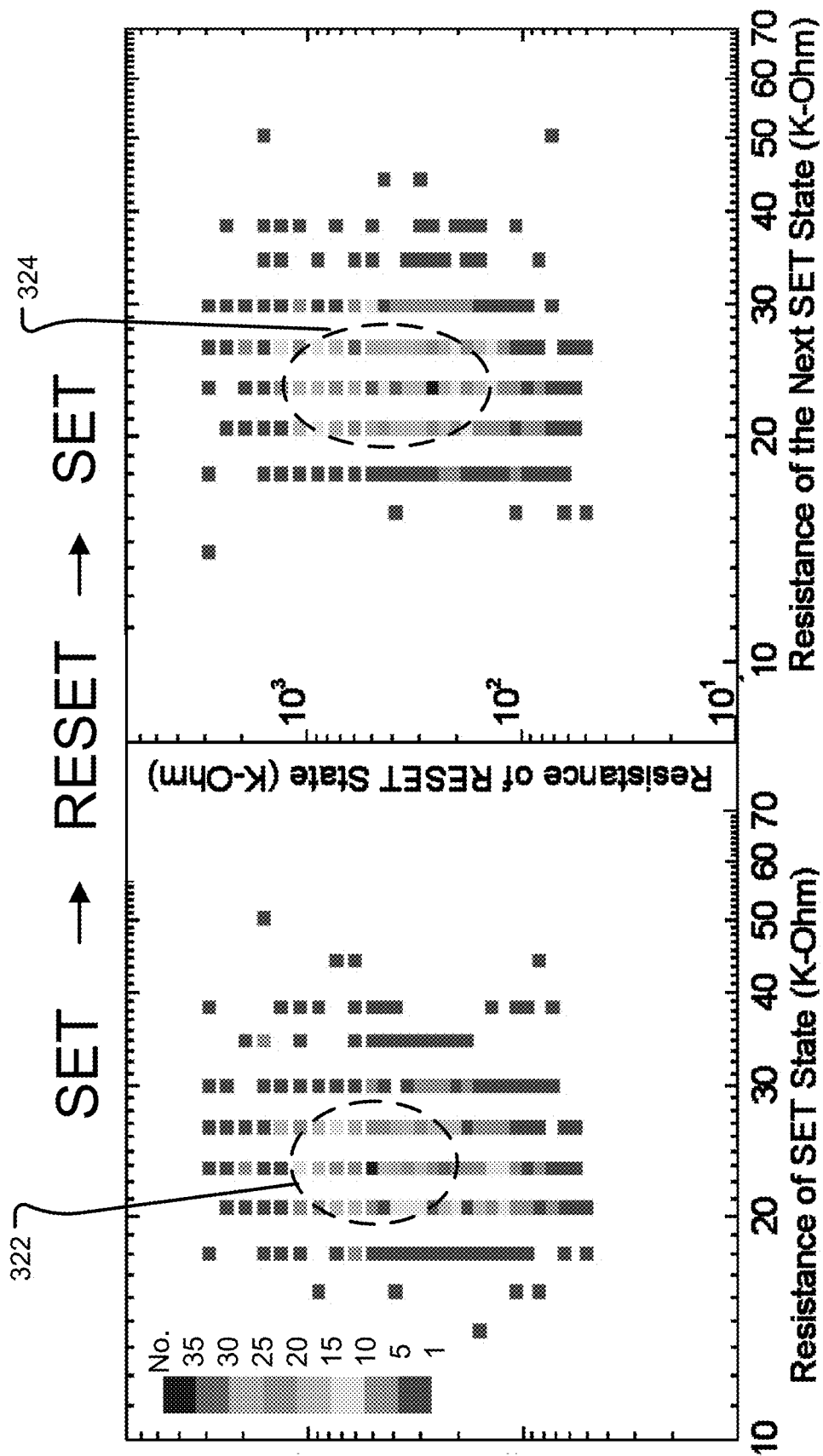
FIGS. 12 and 13 are resistance tracking graphs of the SET state resistance after a SET-RESET-SET sequence of operations.

FIGS. 12 and 13 are resistance tracking graphs of the SET state resistance after a SET-RESET-SET sequence of operations.

The vertical axis with resistance of the reset state is shared between FIGS. 12 and 13. FIGS. 12 and 13 both have a horizontal axis with resistance of the set state. The horizontal axis of FIG. 12 corresponds to the set state before the intermediate reset state corresponding to the vertical axis. The horizontal axis of FIG. 13 corresponds to the set state after the intermediate reset state corresponding to the vertical axis. The quantity of memory cells having both the particular resistance in the reset state, and the particular resistance in the set state, is indicated by the shade of the data point. FIG. 12 shows the highest concentration of data points indicating large quantities in the center 322. FIG. 13 also shows the highest concentration of data points indicating large quantities in the center 324. The variations between FIGS. 12 and 13 show that the resistance of any particular memory cell in the array is unpredictable. However, FIGS. 12 and 13 both show a normal, Gaussian distribution continued through the SET-RESET-SET sequence of operations.

FIG. 14-17 are resistance maps of the array of memory cells through a SET-RESET-SET-RESET sequence of operations with vertical and horizontal positions corresponding to word line and bit line positions.

Figure 14:
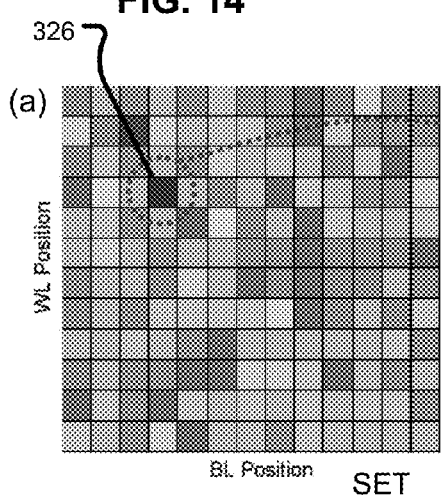
FIG. 14-17 are resistance maps of the array of memory cells through a SET-RESET-SET-RESET sequence of operations with vertical and horizontal positions corresponding to word line and bit line positions.
Figure 15:
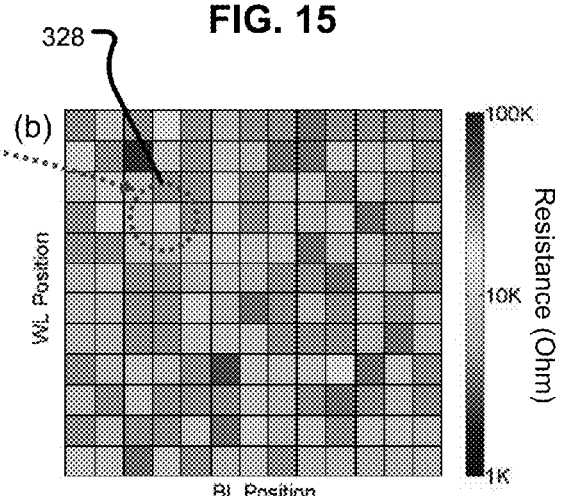
Figure 16:
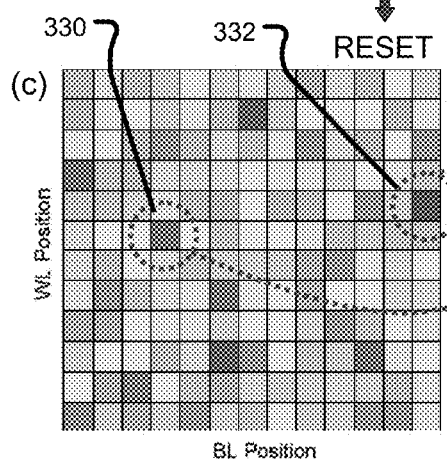
Figure 17:
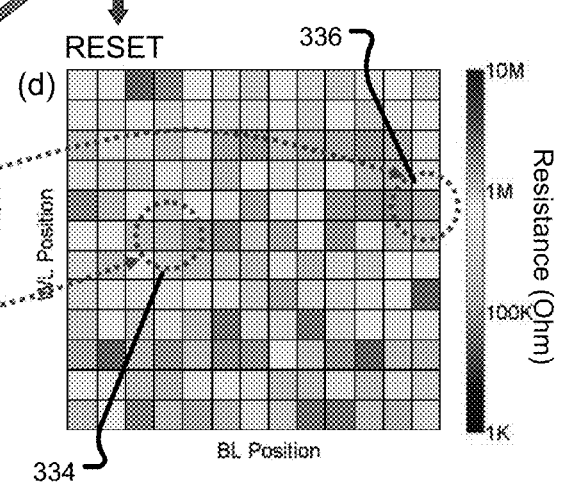

FIG. 14 is a resistance map of a first set state. Then reset programming is performed on the memory array. As a result, FIG. 16 shows the resistance map of a first reset state. Then set programming is performed on the memory array. As a result, FIG. 15 shows the resistance map of a second set state. Then reset programming is performed on the memory array. As a result, FIG. 17 shows the resistance map of a second reset state. In the resistance maps of FIGS. 14-17, the vertical and horizontal positions in the maps corresponding to word line and bit line positions. The resistances of memory cells at particular intersections of word lines and bit lines are indicated by the color at the particular intersections. The same memory cells in the same resistance state are indicated by 326 of FIG. 14 and 328 of FIG. 15, 330 of FIG. 16 and 334 of FIG. 17, and 332 of FIG. 16 and 336 of FIG. 17. Each of these pairs shows multiple magnitudes of order of difference, despite being the same memory cell in supposedly the same resistance state.

Many of the figures generally indicate that the resistance of a particular memory cell which results from a particular programming operation is unpredictable. Many of the figures also generally indicate that the resistance distribution of the overall memory array which results from a particular programming operation is predictable.

Accordingly, when program verify indicates a failed programming attempt, the cause is understood to be not so much a defective memory cell, but an unfavorable statistical result. So ISPP with increasing magnitudes of programming pulses is unnecessary, as opposed to applying nonincreasing magnitudes of programming pulses.

Figure 18:
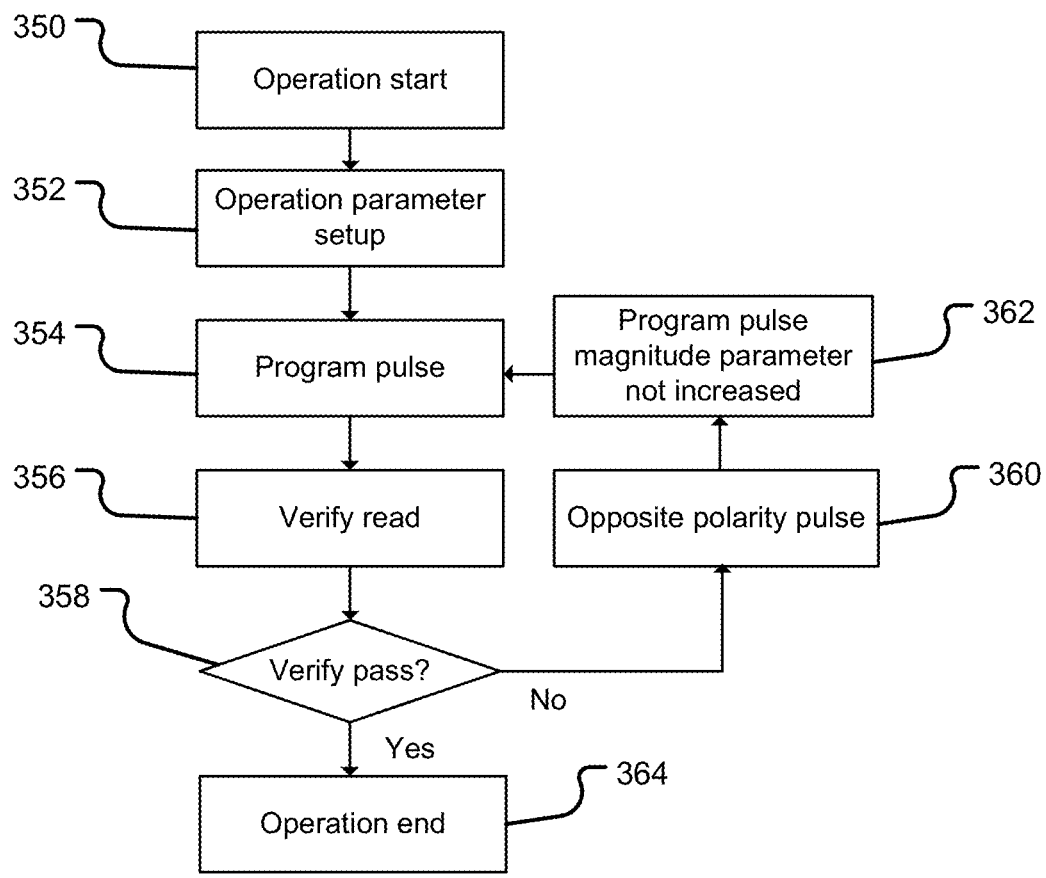
FIG. 18 is an example flowchart of the program-program verify cycle of operations.

FIG. 18 is an example flowchart of the program-program verify cycle of operations. At 350 the programming operation starts. At 352 the operation parameters of the programming operation are fixed, whether for set or reset. An example set of parameters for the programming pulse can include rise time, falling time, pulse width, and amplitude. At 354, the initial cycle beings with a program pulse on the selected memory cell. At 356, the initial cycle continues with a program verify read on the selected memory cell. At 358, depending on whether or not the result of the program verify read shows that the selected memory cell was programmed successfully, the programming operation ends at 364, or subsequent programming cycles are performed. At 360, a subsequent programming cycle begins with an opposite polarity pulse 360 applied to the selected memory cell. The opposite polarity pulse has a polarity which is opposite to the polarity of the programming pulse, whether the programming pulse is for set or reset. At 362, the operation parameter for the program pulse magnitude is not increased, because further strengthening the program conditions is unnecessary. However, this is optional, and in some embodiments ISPP may be performed. Subsequent steps from 354 are similar to the initial programming cycle. An alternative at 358 is to stop programming with a failure result of program verify, due to a maximum number of programming cycles having been attempted.

Figure 19:
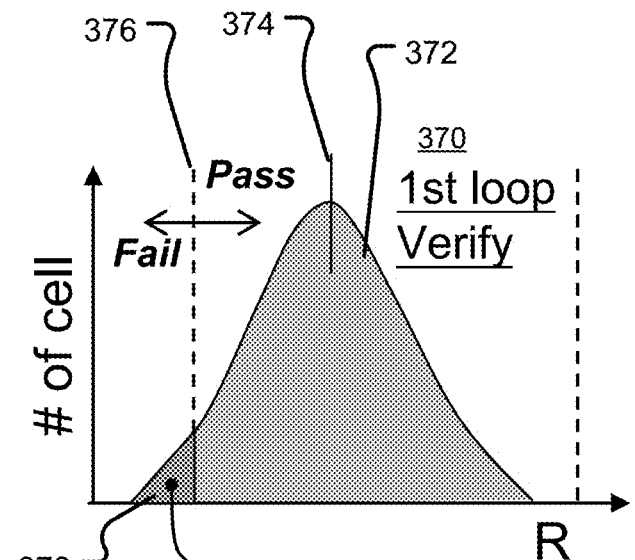
FIGS. 19-21 are graphs of the resistance distribution following each program pulse in a sequence of program pulses.
Figure 20:
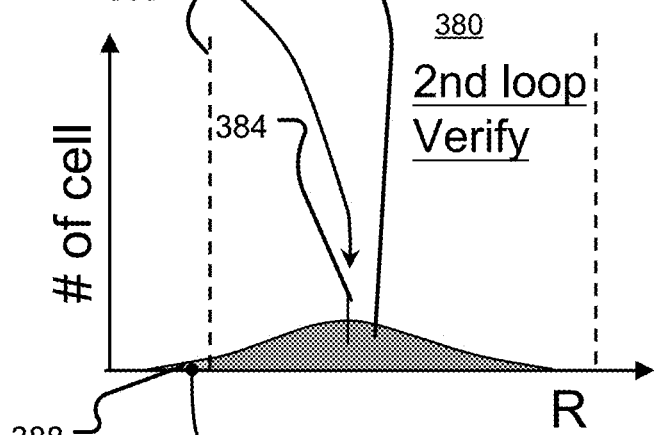
Figure 21:
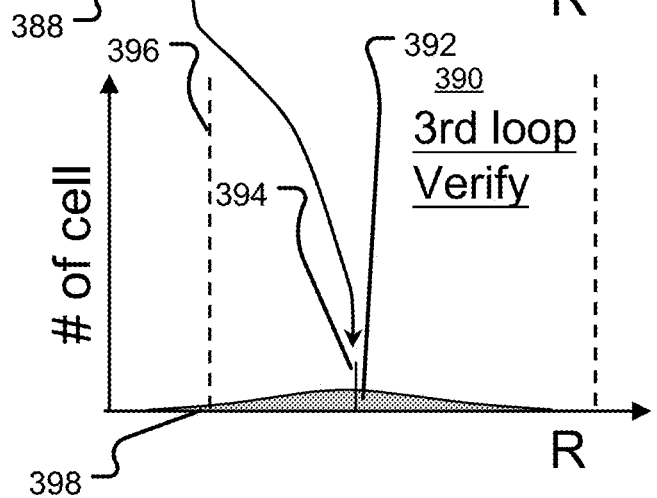

FIGS. 19-21 are graphs of the resistance distribution following each program pulse in a sequence of program pulses. The strength of the program pulse in the subsequent cycles of programming and program verify does not increase, despite failure of program verify in prior cycles.

In FIG. 19, resistance distribution 370 corresponds to a memory array which undergoes an initial cycle of programming and program verify. Program verify threshold 376 separates an upper distribution 372 which passes program verify, from a lower distribution 378 which fails program verify.

In FIG. 20, resistance distribution 380 corresponds to a memory array which undergoes a subsequent cycle of programming and program verify. An arrow connects lower distribution 378 in FIG. 19 with resistance distribution 380 in FIG. 20. The arrow indicates that the memory cells which fail program verify in the initial cycle of programming and program verify in FIG. 19, are also the memory cells which undergo the subsequent cycle of programming and program verify in FIG. 20. Program verify threshold 386 separates an upper distribution 382 which passes program verify, from a lower distribution 388 which fails program verify.

In FIG. 21, resistance distribution 390 corresponds to a memory array which undergoes another subsequent cycle of programming and program verify. An arrow connects lower distribution 388 in FIG. 20 with resistance distribution 390 in FIG. 21. The arrow indicates that the memory cells which fail program verify in the subsequent cycle of programming and program verify in FIG. 20, are also the memory cells which undergo another subsequent cycle of programming and program verify in FIG. 21. Program verify threshold 396 separates an upper distribution 392 which passes program verify, from a lower distribution 398 which fails program verify.

Each graph of the resistance distribution in FIGS. 19-21 has a mean resistance. FIG. 19 has mean resistance 374, FIG. 20 has mean resistance 384, and FIG. 21 has mean resistance 394. Because the strength of the program pulse in the subsequent cycles of programming and program verify does not increase, the mean resistance does not increase from cycle to cycle.

Figure 22:
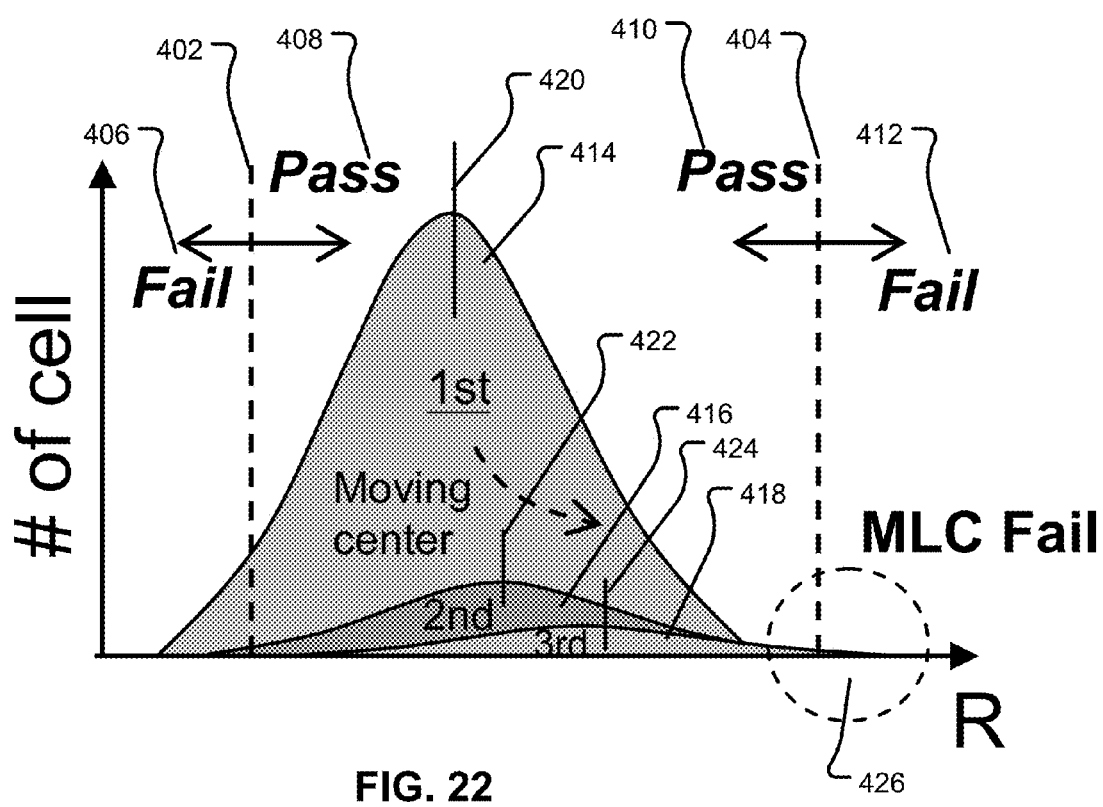
FIG. 22 is a graph of the resistance distributions following each program pulse in a sequence of program pulses.

FIG. 22 is a graph of the resistance distributions following each program pulse in a sequence of program pulses. In contrast with FIGS. 19-21, in FIG. 22 the strength of the program pulse in the subsequent cycles of programming and program verify does increase, after failure of program verify in the prior cycle.

A lower program verify threshold 402 separates memory cells which pass program verify 408, from memory cells which fail program verify 406. A higher program verify threshold 404 separates memory cells which pass program verify 410, from memory cells which fail program verify 412.

Resistance distribution 414 corresponds to a memory array which undergoes an initial cycle of programming and program verify. Resistance distribution 416 corresponds to a memory array which undergoes a subsequent cycle of programming and program verify. Resistance distribution 416 is composed of the memory cells which fail program verify in resistance distribution 414. Resistance distribution 418 corresponds to a memory array which undergoes another subsequent cycle of programming and program verify. Resistance distribution 418 is composed of the memory cells which fail program verify in resistance distribution 416.

Each resistance distribution in FIG. 22 has a mean resistance. Resistance distribution 414 has mean resistance 420, resistance distribution 416 has mean resistance 422, and resistance distribution 418 has mean resistance 424. Because the strength of the program pulse in the subsequent cycles of programming and program verify does increase with each cycle, the mean resistance increases from cycle to cycle. The stronger program pulses cause resistance distribution 418 as a whole to shift upwards. Accordingly, the upper part of resistance distribution 418 exceeds upper program verify threshold 404. Thus, a disproportionately large share of the memory cells in resistance distribution 418 fail due to having a resistance that is too high. This problem of disproportionately high failure due to an overly high resistance does not characterize FIGS. 19-21, because the nonincreasing program pulses in the subsequent program verify cycles do not tend to shift the resistance distribution upwards.

Figure 23:
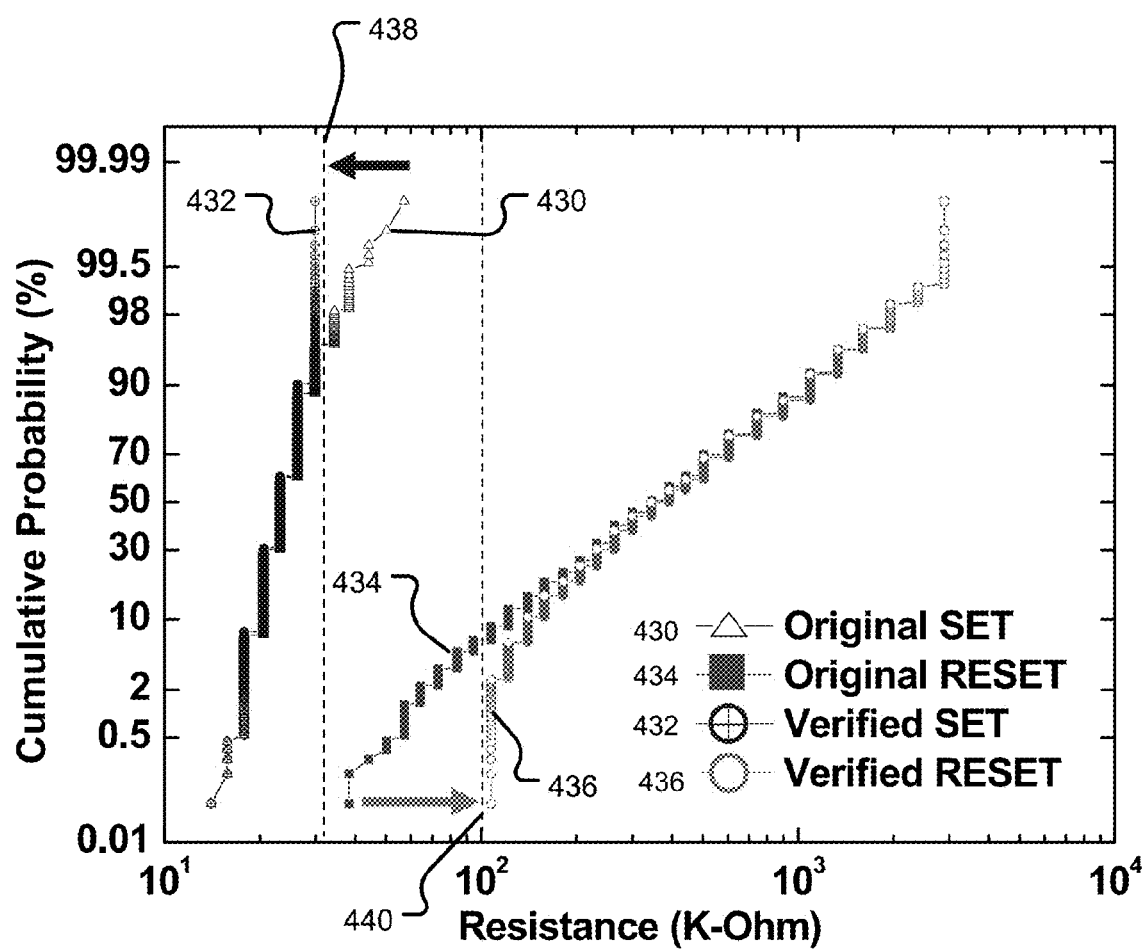
FIG. 23 is a cumulative probability graph of the resistance distribution of the memory array, after successful program verify.

FIG. 23 is a cumulative probability graph of the resistance distribution of the memory array, after successful program verify.

Traces 430 and 432 show the low resistance state distribution of the array after set programming. Trace 430 shows the low resistance state resistance distribution prior to program verify, and trace 432 shows the low resistance state resistance distribution after program verify. Due to program verify, the high resistance portion of trace 430 is adjusted downwards to below lower program verify threshold 438.

Traces 434 and 436 show the high resistance state distribution of the array after reset programming. Trace 434 shows the high resistance state resistance distribution prior to program verify, and trace 436 shows high low resistance state resistance distribution after program verify. Due to program verify, the low resistance portion of trace 434 is adjusted upwards to above higher program verify threshold 440. The program verify thresholds, or resistance trimming boundaries, are 30 kilohms and 100 kilohms, so the resistance window is 70 kilohms wide.

Figure 24:
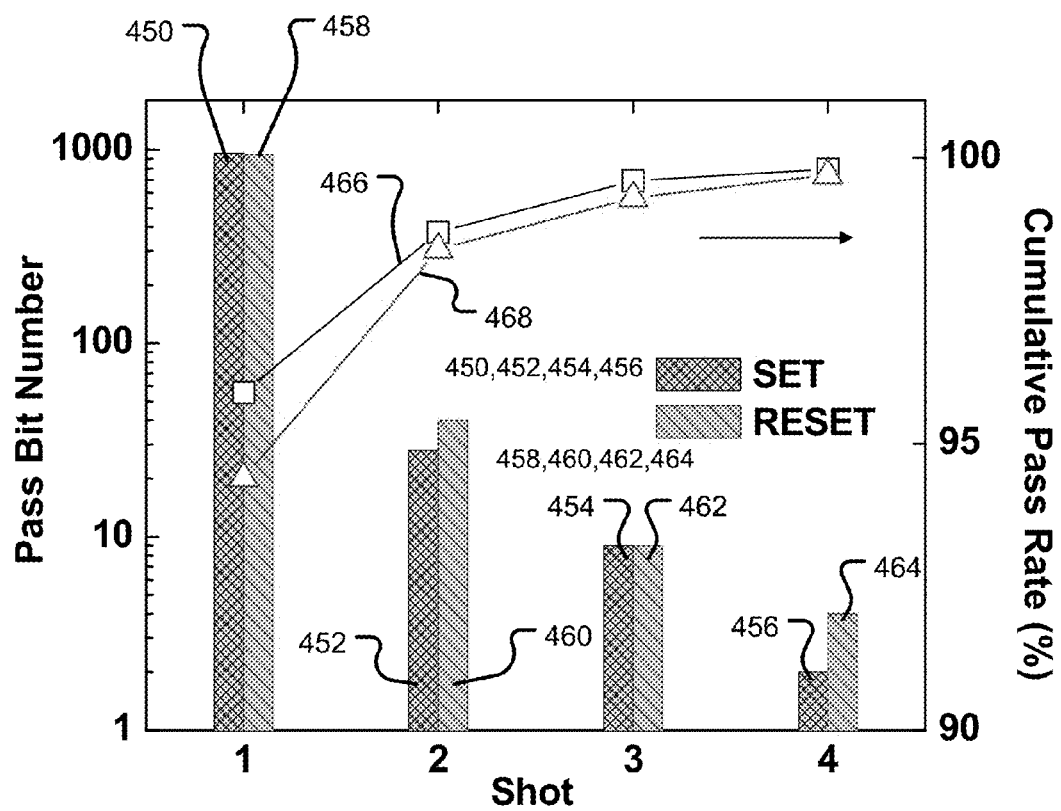
FIG. 24 is a graph of pass bit numbers and cumulative pass rate for SET and RESET programming operations after each program-verify loop.

FIG. 24 is a graph of pass bit numbers and cumulative pass rate for SET and RESET programming operations after each program-verify loop.

The left vertical axis shows pass bit number, which indicates the number of memory cells that pass program verify after a particular shot, or cycle of programming and program verify. The left vertical axis supports the bar chart of memory cells which pass program verify after SET and RESET cycles. Bars 450 and 458 show, for set and reset programming respectively, the number of memory cells that pass program verify after shot #1. Bars 452 and 460 show, for set and reset programming respectively, the number of memory cells that pass program verify after shot #2. Bars 454 and 462 show, for set and reset programming respectively, the number of memory cells that pass program verify after shot #3. Bars 456 and 464 show, for set and reset programming respectively, the number of memory cells that pass program verify after shot #4. Because most of the memory cells successful pass verify after a particular shot, each successive shot is applied to fewer and fewer remaining memory cells which have not been programmed successfully yet, as indicated by the decreasing bar heights in the log scale.

The right vertical axis shows the cumulative pass rate after a particular shot, or cycle of programming and program verify. The right vertical axis corresponds to the curves 466 and 468 which are the cumulative pass rates for set and reset shots respectively. FIG. 24 shows that the pass rates remain stable from shot to shot, which supports the statistical treatment of program verify introduced in connection with FIGS. 8 and 9.

Figure 25:
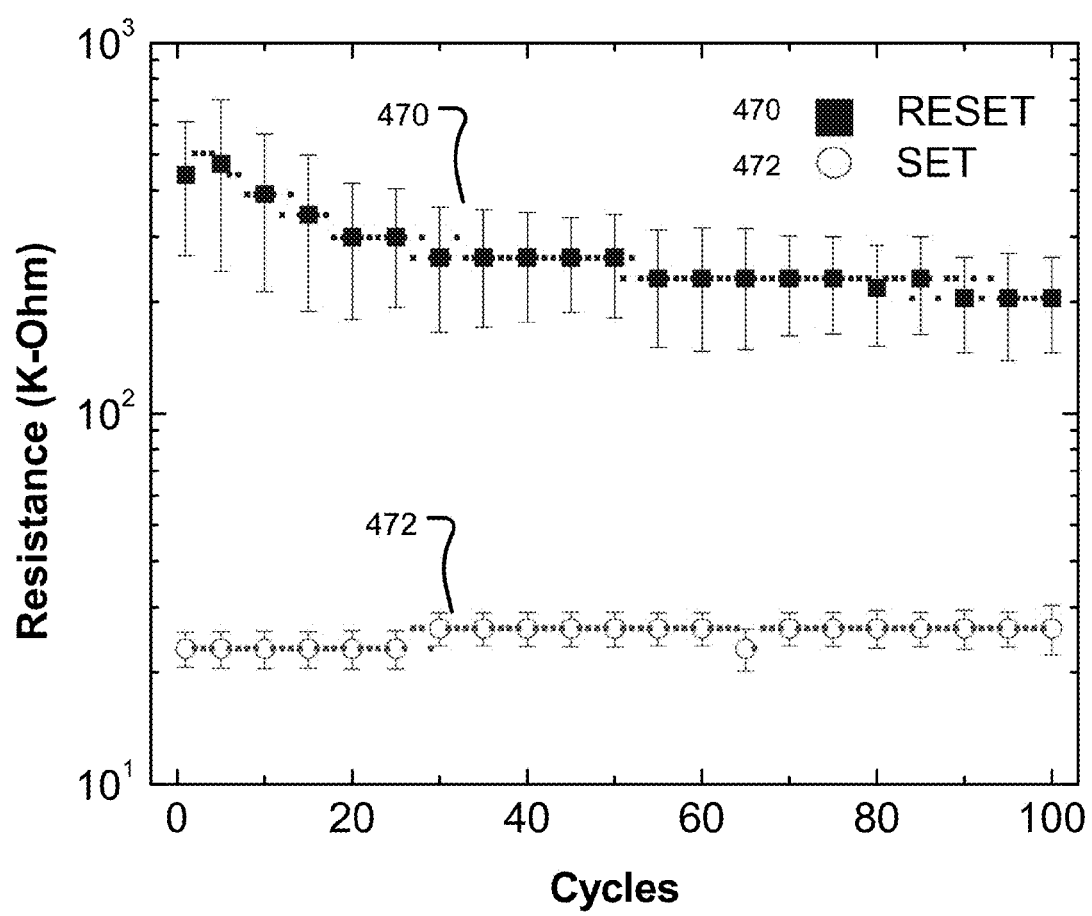
FIG. 25 is a graph of reset and set resistances with increasing cycles.

FIG. 25 is a graph of reset and set resistances with increasing cycles. With a 1 kilobit array, trace 470 shows the array resistance median and standard deviations in the reset state, with an increasing number of reset-set cycles. With the 1 kilobit array, trace 472 shows the array resistance median and standard deviations in the set state, with an increasing number of reset-set cycles.

Figure 26:
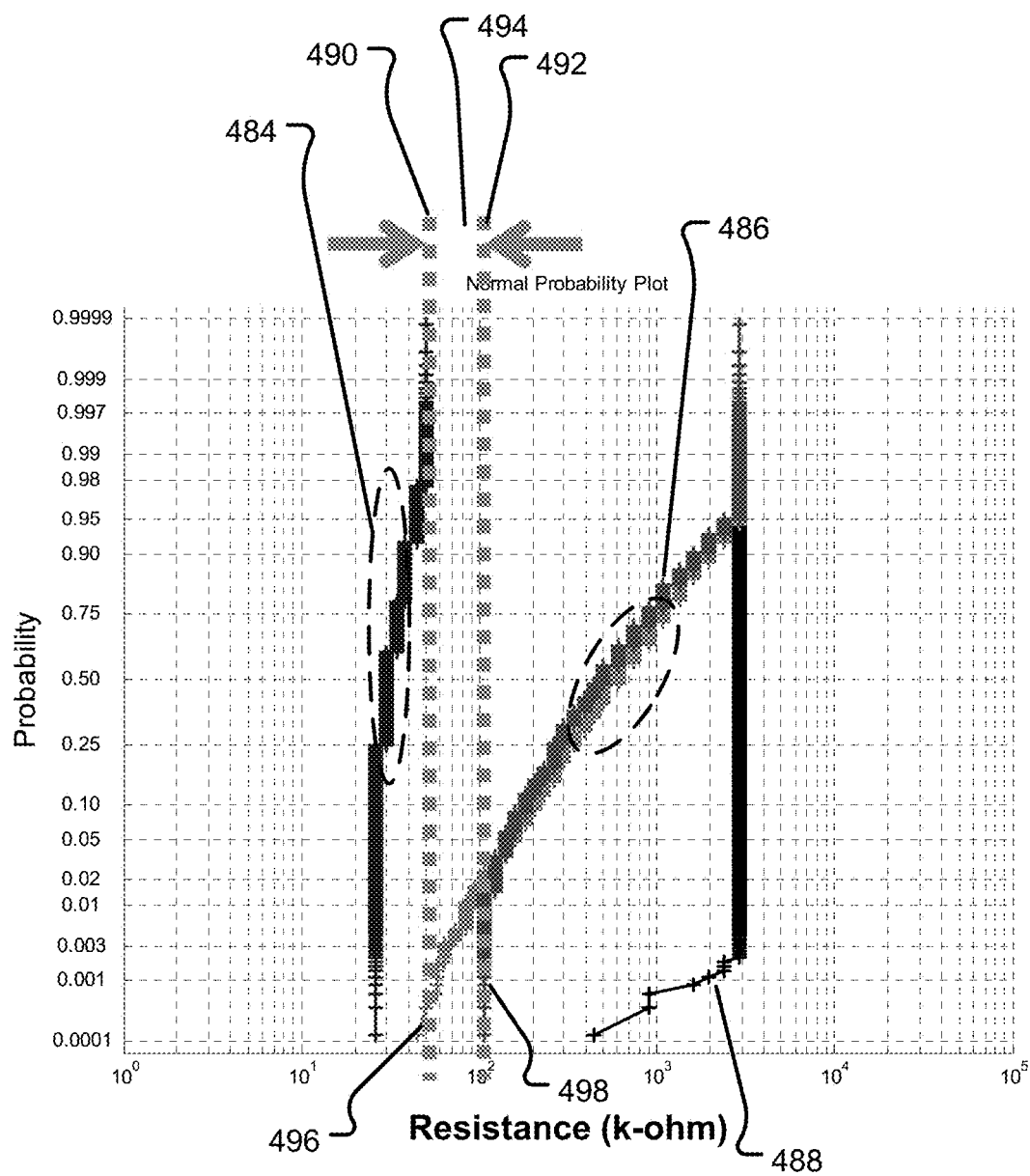
FIG. 26 is a cumulative probability graph of the resistance distribution of the memory array, after a set programming pulse and after a reset programming pulse, showing the absence of a resistance window without program verify.

FIG. 26 is a cumulative probability graph of the resistance distribution of the memory array, after a set programming pulse and after a reset programming pulse, showing the absence of a resistance window without program verify.

Trace 484 shows the low resistance state distribution of the array after set programming. Due to program verify, the trace 484 is below lower program verify threshold 490. Trace 486 shows the high resistance state distribution of the array after reset programming. Due to program verify, trace 486 is above higher program verify threshold 492. The program verify thresholds, or resistance trimming boundaries 490 and 492 leave a resistance window 494. The resistance window 494 is open tail-to-tail, or for over 99.99% of the array.

Figure 27:
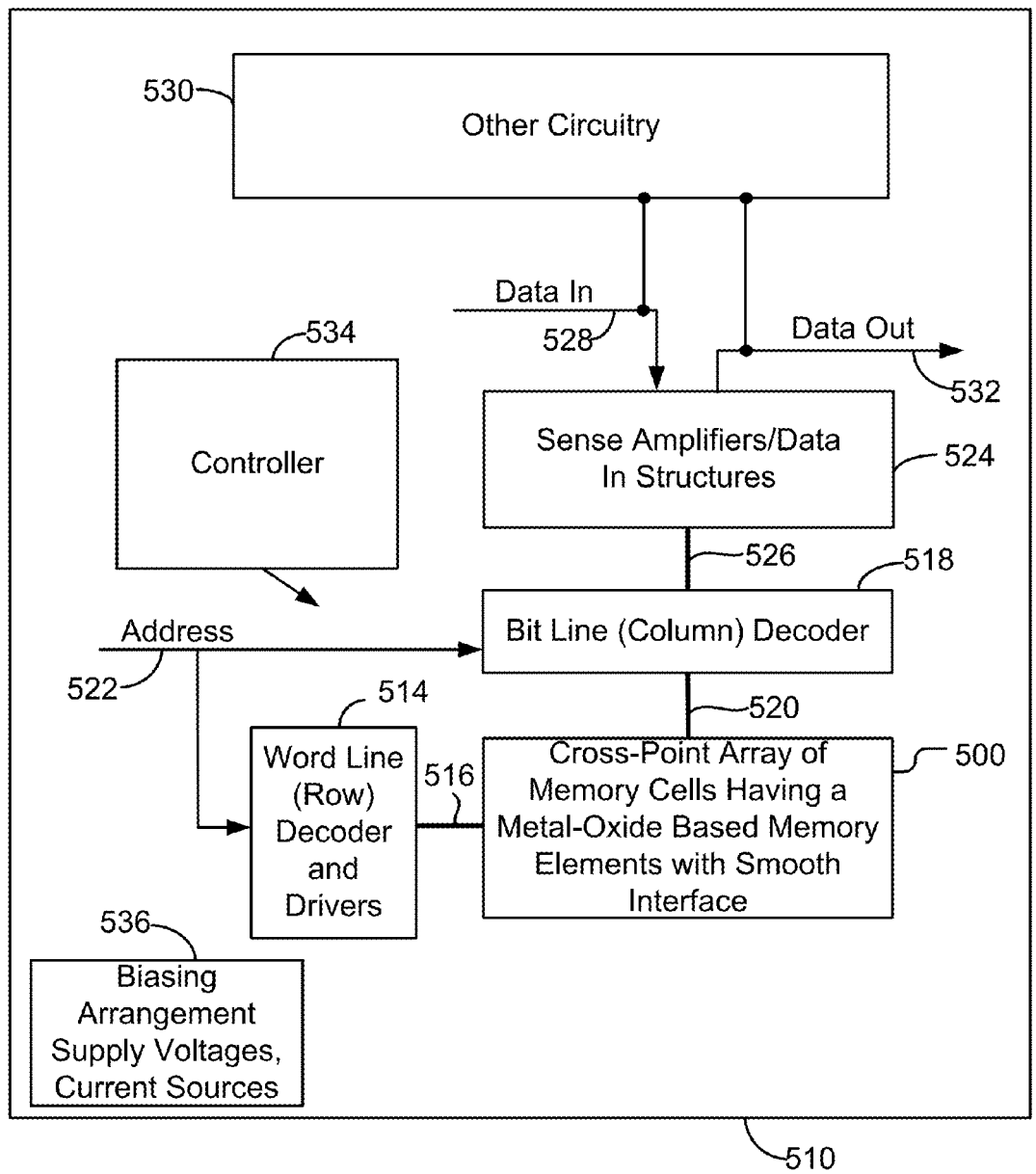
FIG. 27 is a simplified block diagram of an integrated circuit array in accordance with an embodiment.

FIG. 27 is a simplified block diagram of an integrated circuit array in accordance with an integrated circuit embodiment 510 including a cross-point memory array of memory cells 500. A word line decoder 514 is coupled to and in electrical communication with a plurality of word lines 516. A bit line (column) decoder 518 is in electrical communication with a plurality of bit lines 520 to read data from, and write data to, the memory cells in the array 500. Addresses are supplied on bus 522 to word line decoder and drivers 514 and bit line decoder 518. Sense amplifiers and data-in structures in block 524 are coupled to bit line decoder 518 via data bus 526. Data is supplied via a data-in line 528 from input/output ports on integrated circuit 510, or from other data sources internal or external to integrated circuit 510, to data-in structures in block 524. Other circuitry 530 may be included on integrated circuit 510, such as a general purpose processor or special purpose application circuitry, or a combination of modules providing system-on-a-chip functionality supported by memory array 100. Data is supplied via a data-out line 532 from the sense amplifiers in block 524 to input/output ports on integrated circuit 510, or to other data destinations internal or external to integrated circuit 510.

A controller 534 implemented in this example, using a bias arrangement state machine, controls the application of bias arrangement supply voltages 536, such as read voltages, program voltages such as set and reset, and program verify voltages such as for set and reset. Controller 534 may be implemented using special-purpose logic circuitry as known in the art. In alternative embodiments, controller 534 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 534.

While the present technology is disclosed by reference to the preferred embodiments and examples detailed herein, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. An integrated circuit, comprising:
a programmable element comprising metal oxide; and
circuitry coupled to the programmable element, the circuitry configured to execute a program-verify operation including:
  (i) an initial program-verify cycle including:
    applying an initial program pulse having a first polarity to the programmable element to establish a cell resistance of the programmable element; and then
    determining whether the cell resistance of the programmable element is within a target resistance range; and then
  (ii) subsequent program-verify cycles performed if the cell resistance of the programmable element is not within the target resistance range, iterated until the cell resistance of the programmable element is within the target resistance range,
  wherein at least one of the subsequent program-verify cycles to establish the cell resistance of the programmable element within the target range includes:
    applying an opposite polarity pulse having a second polarity to the programmable element, the first polarity and the second polarity having opposite polarities; and
    applying a subsequent program pulse having the first polarity to the programmable element; and then
    determining whether the cell resistance of the programmable element is within the target resistance range.

2. The integrated circuit of claim 1, wherein the initial program pulse and the subsequent program pulse are reset pulses.

3. The integrated circuit of claim 1, wherein the initial program pulse and the subsequent program pulse are set pulses.

4. The integrated circuit of claim 1, wherein a first magnitude of the initial program pulse is at least as large as a later magnitude of the subsequent program pulse.

5. The integrated circuit of claim 1, wherein another program-verify operation includes another initial program-verify cycle followed by further subsequent program-verify cycles.

6. The integrated circuit of claim 1, wherein the programmable element has a programmable resistance.

7. The integrated circuit of claim 1, wherein the subsequent program-verify cycles are iterated until the cell resistance of the programmable element is within the target resistance range or a maximum number of program-verify cycles is performed.

8. The integrated circuit of claim 1, wherein the at least one subsequent program-verify cycle includes only one step to determine whether the cell resistance of the first memory cell is within the target range.

9. An integrated circuit, comprising:
an array of memory cells having programmable elements comprising metal oxide; and
circuitry coupled to the memory cells in the array, the circuitry configured to execute a program-verify operation on at least a first memory cell in the array, including:
  (i) an initial program-verify cycle including:
    applying an initial program pulse having a first polarity to the first memory cell to establish a cell resistance of the memory cell; and then
    determining whether the cell resistance of the first memory cell is within a target resistance range; and then
  (ii) subsequent program-verify cycles performed if the cell resistance of the memory cell is not within the target resistance range, the subsequent cycles iterated until the cell resistance of the first memory cell is within the target resistance range,
  wherein at least one of the subsequent program-verify cycles to establish the cell resistance of the programmable element within the target range includes:
    applying an opposite polarity pulse having a second polarity to the first memory cell, the first polarity and the second polarity having opposite polarities; and
    applying a subsequent program pulse having the first polarity to the first memory cell; and then
    determining whether the cell resistance of the first memory cell is within the target resistance range.

10. The integrated circuit of claim 9, wherein a first subset of the array of memory cells is programmed to within the target resistance range after only the initial program-verify cycle, and wherein a second subset of the array of memory cells is programmed to within the target resistance range after the initial program-verify cycle and at least one of the subsequent program-verify cycles, and wherein a first mean resistance of the first subset of the array of memory cells is at least as large as a second mean resistance of the second subset of the array of memory cells.

11. The integrated circuit of claim 9, wherein, a first magnitude of the initial program pulse is at least as large as a later magnitude of the subsequent program pulse and a cumulative pass rate for the memory cells in the array increases with an additional one of the subsequent program-verify cycles.

12. The integrated circuit of claim 9, wherein the initial program pulse and the subsequent program pulse are reset pulses.

13. The integrated circuit of claim 9, wherein the initial program pulse and the subsequent program pulse are set pulses.

14. The integrated circuit of claim 9, wherein a first magnitude of the initial program pulse is at least as large as a later magnitude of the subsequent program pulse.

15. The integrated circuit of claim 9, wherein another program-verify operation includes another initial program-verify cycle followed by further subsequent program-verify cycles.

16. The integrated circuit of claim 9, wherein the memory cells of the array have a plurality of programmable resistances.

17. The integrated circuit of claim 9, wherein the at least one subsequent program-verify cycle includes only one step to determine whether the cell resistance of the first memory cell is within the target range.

18. A method, comprising:
executing a program-verify operation on at least a first memory cell comprising a programmable element comprising metal oxide in a memory array of an integrated circuit, including:
(i) performing an initial program-verify cycle including:
applying an initial program pulse having a first polarity to the first memory cell to establish a cell resistance of the first memory cell; and then
determining whether the cell resistance of the first memory cell is within a target resistance range; and then
(ii) performing subsequent program-verify cycles if the cell resistance of the first memory cell is not within the target resistance range, the subsequent program-verify cycles iterated until the cell resistance of the first memory cell is within the target resistance range,
wherein at least one of the subsequent program-verify cycles to establish the cell resistance of the programmable element within the target range includes:
applying an opposite polarity pulse having a second polarity to the first memory cell, the first polarity and the second polarity having opposite polarities; and
applying a subsequent program pulse having the first polarity to the first memory cell; and then
determining whether the cell resistance of the first memory cell is within the target resistance range.

19. The method of claim 18, wherein the initial program pulse and the subsequent program pulse are reset pulses.

20. The method of claim 18, wherein the initial program pulse and the subsequent program pulse are set pulses.

21. The method of claim 18, wherein the first memory cell has a programmable resistance.

22. The method of claim 18, wherein a first magnitude of the initial program pulse is at least as large as a later magnitude of the subsequent program pulse.

23. The method of claim 18, wherein the at least one subsequent program-verify cycle includes only one step to determine whether the cell resistance of the first memory cell is within the target range.

* * * * *